United States Patent [19]
Fukuda et al.

[11] Patent Number: 5,985,414
[45] Date of Patent: Nov. 16, 1999

[54] LAMINATED ELECTRONIC COMPONENT

[75] Inventors: Yoshihiro Fukuda, Takefu; Takahiro Azuma, Fukui, both of Japan

[73] Assignee: Murata Manufacturing Co., Ltd., Nagaokakyo, Japan

[21] Appl. No.: 08/928,421

[22] Filed: Sep. 12, 1997

[30] Foreign Application Priority Data

Sep. 12, 1996 [JP] Japan .................................. 8-241987

[51] Int. Cl.$^6$ ........................... B32B 23/02; H01G 4/228
[52] U.S. Cl. ......................... 428/192; 428/209; 428/210; 428/432; 428/433; 428/901; 361/309; 361/321.2
[58] Field of Search .................................. 428/210, 209, 428/192, 432, 433, 901; 361/309, 321.2

[56] References Cited

U.S. PATENT DOCUMENTS

| | | | |
|---|---|---|---|
| 3,679,950 | 7/1972 | Rutt | 117/227 |
| 4,071,880 | 1/1978 | Rutt | 428/192 |
| 4,675,644 | 6/1987 | Ott et al. | 338/21 |
| 4,889,760 | 12/1989 | Kippenberg et al. | 428/210 |
| 5,312,674 | 5/1994 | Haertling et al. | 428/210 |
| 5,453,316 | 9/1995 | Morii et al. | 428/210 |
| 5,512,353 | 4/1996 | Yokotani et al. | 428/210 |

*Primary Examiner*—Deborah Jones
*Assistant Examiner*—Cathy F. Lam
*Attorney, Agent, or Firm*—Burns, Doane, Swecker & Mathis, LLP

[57] ABSTRACT

A laminated inductor includes a laminate formed by stacking insulating sheets on which coil conductors are formed, and outermost insulating sheets. The coil conductors are connected in series by via-holes to form a coil. The direction in which the insulating sheets are stacked is perpendicular to input/output external electrodes, and is parallel to a mounting surface. The thickness of the outermost insulating layer is set larger than the radius of a rounded corner of the laminate and the length of a folded portion of the external electrode.

21 Claims, 5 Drawing Sheets

LAMINATED ELECTRONIC COMPONENT

This application is based on Japanese Patent Application No. 8-241987, filed on Sep. 12, 1996, which is incorporated herein in its entirety by reference.

BACKGROUND OF THE INVENTION

1. Field of the Invention

The present invention relates to laminated electronic components such as laminated capacitors, laminated inductors and laminated LC filters, and the like.

2. Description of the Related Art

Laminated electronic components are known which include a laminate formed by stacking internal electrodes and insulating sheets. In this type of component, the insulating sheets used have an approximately equal thickness. Since an external mechanical shock easily causes a break or other damage in the corners of the laminate, the laminate is processed by barrel polishing by rounding the laminate corners to prevent the break or other damage.

As shown in FIG. 9, an electronic component 51 is shown having a structure in which the direction for stacking internal electrodes (not shown) and insulating sheets 52 is perpendicular to external electrodes 53 and 54 formed on two opposing sides of a laminate of the sheets. Mechanical stress exerted in the barrel polishing process for preventing breakage in the laminate corners decreases the interlayer adhesion at corners 55. As a result, interlayer peeling may occur easily at the corners 55.

Mounting the electronic component 51 on a circuit base member 61 causes an external mechanical stress (e.g., a stress caused by thermal expansion and contraction in soldering, a warp of the circuit base member 61, and so forth) exerted through solder fillets 62 and 63. This stress concentrates on the interface between the external electrodes and the insulating sheets 52 or the mutual interfaces of the insulating sheets 52. Thus, there is a possibility of interlayer peeling occurring at the corner 55 where interlayer adhesion decreases due to the mechanical stress in barrel polishing.

SUMMARY OF THE INVENTION

Accordingly, it is an object of the present invention to provide a laminated electronic component capable of preventing interlayer peeling caused by a mechanical stress exerted in barrel polishing and an external mechanical stress exerted through a solder fillet when the laminated electronic component is mounted on a circuit base member or the like.

To this end, according to an exemplary aspect of the present invention, the foregoing object has been achieved through provision of a laminated electronic component including a laminate formed by stacking internal conductors and insulators, wherein the direction in which the internal conductors and the insulators are stacked is perpendicular to external electrodes respectively formed on two opposed sides of the laminate, and the thickness of an outermost insulator of the laminate is larger than the radius of a rounded corner of the laminate.

According to another exemplary aspect of the present invention, the foregoing object has been achieved through provision of a laminated electronic component including a laminate formed by stacking internal conductors and insulators, wherein the direction in which the internal conductors and the insulators are stacked is perpendicular to external electrodes respectively formed on two opposed sides of the laminate, and the thickness of an outermost insulator of the laminate is larger than the length of a folded portion of the an external electrode.

According to the present invention, the thickness of the outermost insulator of the laminate is set larger than the radius of a rounded corner of the laminate or the length of a folded portion of an external electrode, which prevents interlayer peeling from occurring in the body of the electronic component even if an external mechanical stress is exerted through solder fillets on the electronic component mounted on a circuit base member. As a result, breakage such as interlayer peeling or cracking of the electronic component mounted on a circuit base member can be prevented.

BRIEF DESCRIPTION OF THE DRAWINGS

The foregoing and other, objects, features and advantages of the present invention will be more readily understood upon reading the following detailed description in conjunction with the drawings in which.

DESCRIPTION OF THE PREFERRED EMBODIMENTS

Laminated electronic components according to exemplary embodiments of the present invention will be described below with reference to the attached drawings.

First Embodiment (FIGS. 1 to 4)

Figure 1:
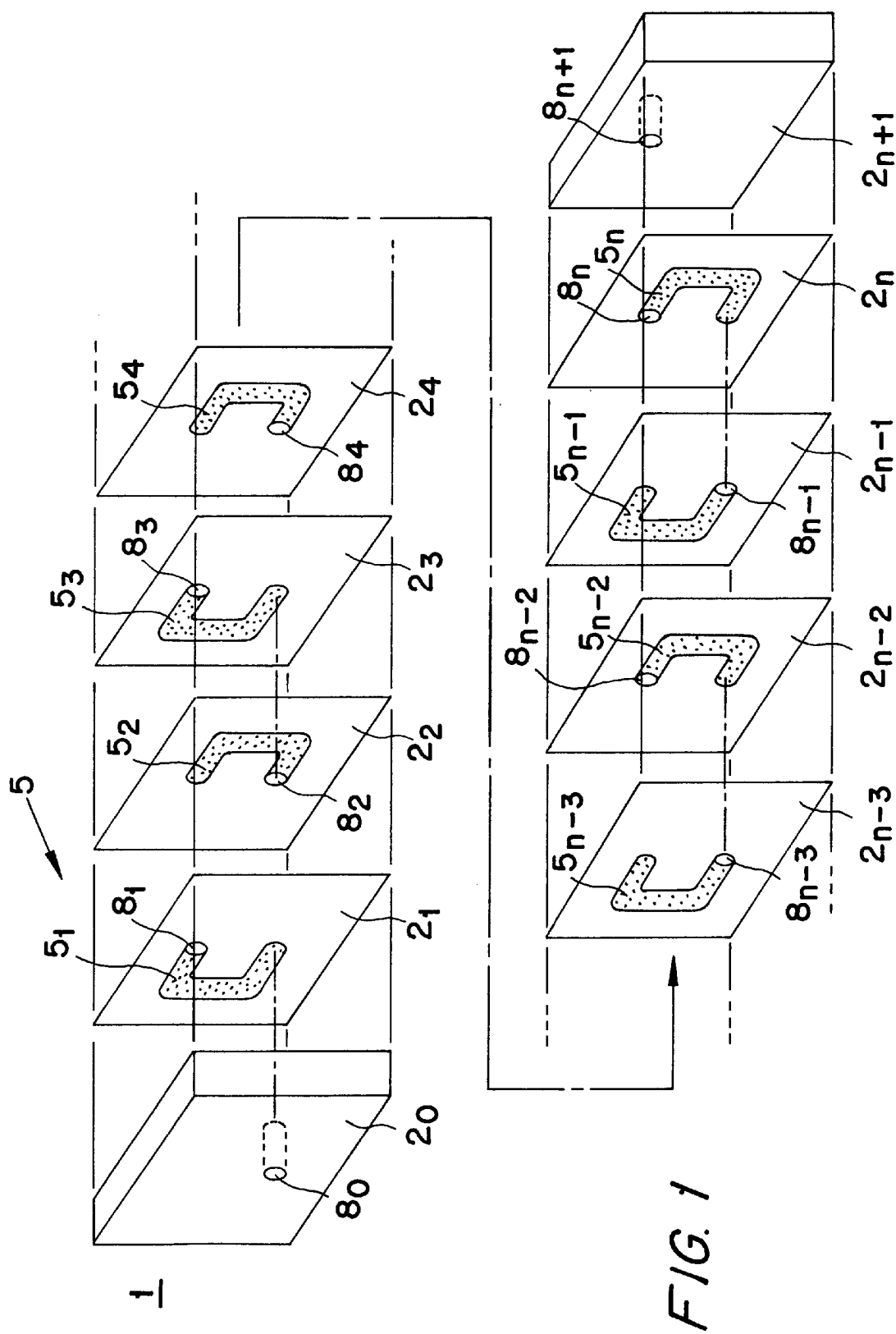
FIG. 1 is an exploded perspective view showing a laminated electronic component according to a first exemplary embodiment of the present invention.

A laminated inductor will be described for a first exemplary embodiment of the present invention. As shown in FIG. 1, a laminated inductor 1 includes insulating sheets $2_1$, $2_2$, $2_3$ to $2_n$ on which coil conductors $5_1$, $5_2$, $5_3$ to $5_n$ are respectively formed, and insulating sheets $2_0$ and $2_{n+1}$ on which extension via-holes $8_0$ and $8_{n+1}$ are respectively formed. A solenoid 5 is formed by electrically connecting the coil conductors $5_1$ to $5_n$ in series via relay via-holes $8_1$ to $8_n$ formed respectively on the insulating sheets $2_1$ to $2_n$.

The coil conductors $5_1$ to $5_n$ are composed of materials such as Ag, Pd, Ag-Pd and Cu, or the like, and are formed on surfaces of the insulating sheets $2_0$ to $2_n$ by the so-called printing method, sputtering, vacuum deposition, or other technique. Ferrite or dielectric is used as the material for the insulating sheets $2_0$ to $2_{n+1}$, for example. The thicknesses of the insulating sheets $2_0$ to $2_n$ are set to, for example, approximately 20 to 30 μm. In this case, for example, the thickness d1 (with reference to FIG. 3) of the outermost insulating sheet $2_0$ or $2_{n+1}$ is set to approximately 50 to 100 μm or more.

Figure 2:
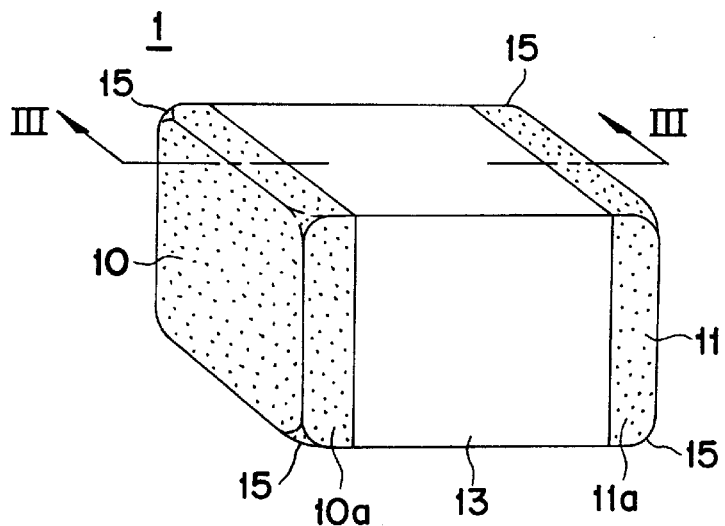
FIG. 2 is a perspective view showing the exterior of the laminated electronic component shown in FIG. 1.
Figure 3:
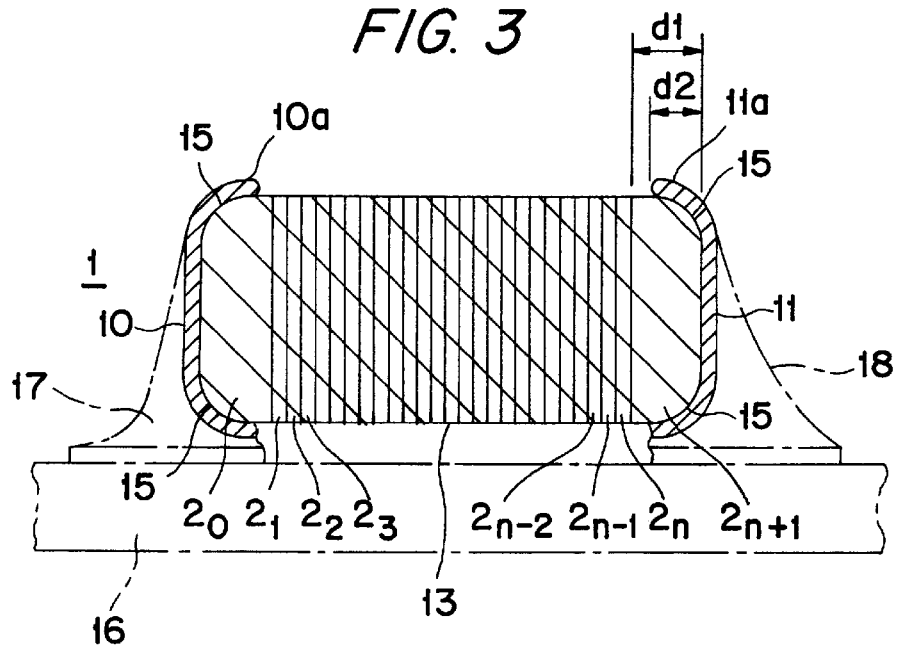
FIG. 3 is a cross-sectional view taken along line III—III shown in FIG. 2.

The respective insulating sheets $2_0$ to $2_{n+1}$ are stacked, and are subsequently sintered together to form a laminate. Next, as shown in FIGS. 2 and 3, the corners 15 of the laminate are rounded by barrel polishing. The radius of the rounded corners 15 is set equal to or less than the thickness d1 of the outermost insulating sheet $2_0$ or $2_{n+1}$. Accordingly, a mechanical stress exerted when barrel polishing is performed is not exerted on the mutual interfaces of the insulating sheets. This eliminates the deterioration of the interlayer adhesion at the corners 15. The specific radius of the rounded corners 15 is, for example, between approximately 50 and 100 μm.

Next, input/output external electrodes 10 and 11 are formed on the left and right sides of the laminate. The length d2 of a folded portion 10a or 11a of the input/output external electrode 10 or 11, respectively, is set equal to or less than the thickness d1 of the outermost insulating sheet $2_0$ or $2_{n+1}$, respectively. The specific length d2 of the folded portion 10a or 11a is, for example, between approximately 50 and 100 μm.

Figure 4:
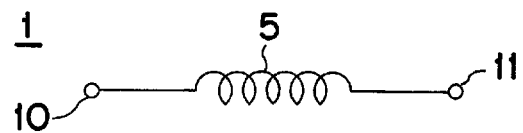
FIG. 4 is an electrical equivalent circuit diagram of the laminated electronic component shown in FIG. 2.

The input/output external electrodes 10 and 11 are formed by a method such as baking after coating, sputtering, vacuum deposition, or other technique. The input/output external electrode 10 is electrically connected via the extension via-hole $8_0$ to one end of the coil 5; specifically, the electrode 10 is connected to one end of the coil conductor $5_1$. The input/output external electrode 11 is electrically connected via the extension via-hole $8_{n+1}$ to another end of the coil 5; specifically, the electrode 11 is connected to one end of the coil conductor $5_n$. FIG. 4 shows an electrical equivalent circuit diagram of the inductor 1.

When the thus obtained inductor 1 is mounted on a circuit base member 16, the axial direction of the coil 5 is perpendicular to the input/output external electrodes 10 and 11, and is parallel to a mounting surface 13 (shown in FIGS. 2 and 3). Thus, since the direction of a magnetic flux φ generated in the coil 5 is parallel to the mounting surface 13, the magnetic flux φ is hardly weakened by a large conductor pattern such as a ground formed on the circuit base member 16. As a result, the decline in the self-inductance value or Q value of the inductor 1 decreases.

In addition, the thickness d1 of the outermost insulating sheet $2_0$ or $2_{n+1}$ is set to more than the radius of the rounded corner 15 and the length d2 of the folded portion 10a or 11a of the input/output external electrode 10 or 11. Thus, the inductor 1 has a structure in which an external mechanical stress (for example, stress caused by thermal expansion and contraction in soldering, or a warp of the circuit base member 16) exerted through solder fillets 17 and 18 is hardly exerted on the interfaces between the coil conductors $5_1$ to $5_n$ and the insulating sheets $2_0$ to $2_{n+1}$, respectively, or the mutual interfaces of the insulating sheets $2_0$ to $2_{n+1}$. As a result, the structure prevents the occurrence of breakage such as interlayer peeling and cracking of the inductor 1.

Second Embodiment (FIGS. 5 to 8)

A laminated LC filter will be described for a second exemplary embodiment of the present invention.

Figure 5:
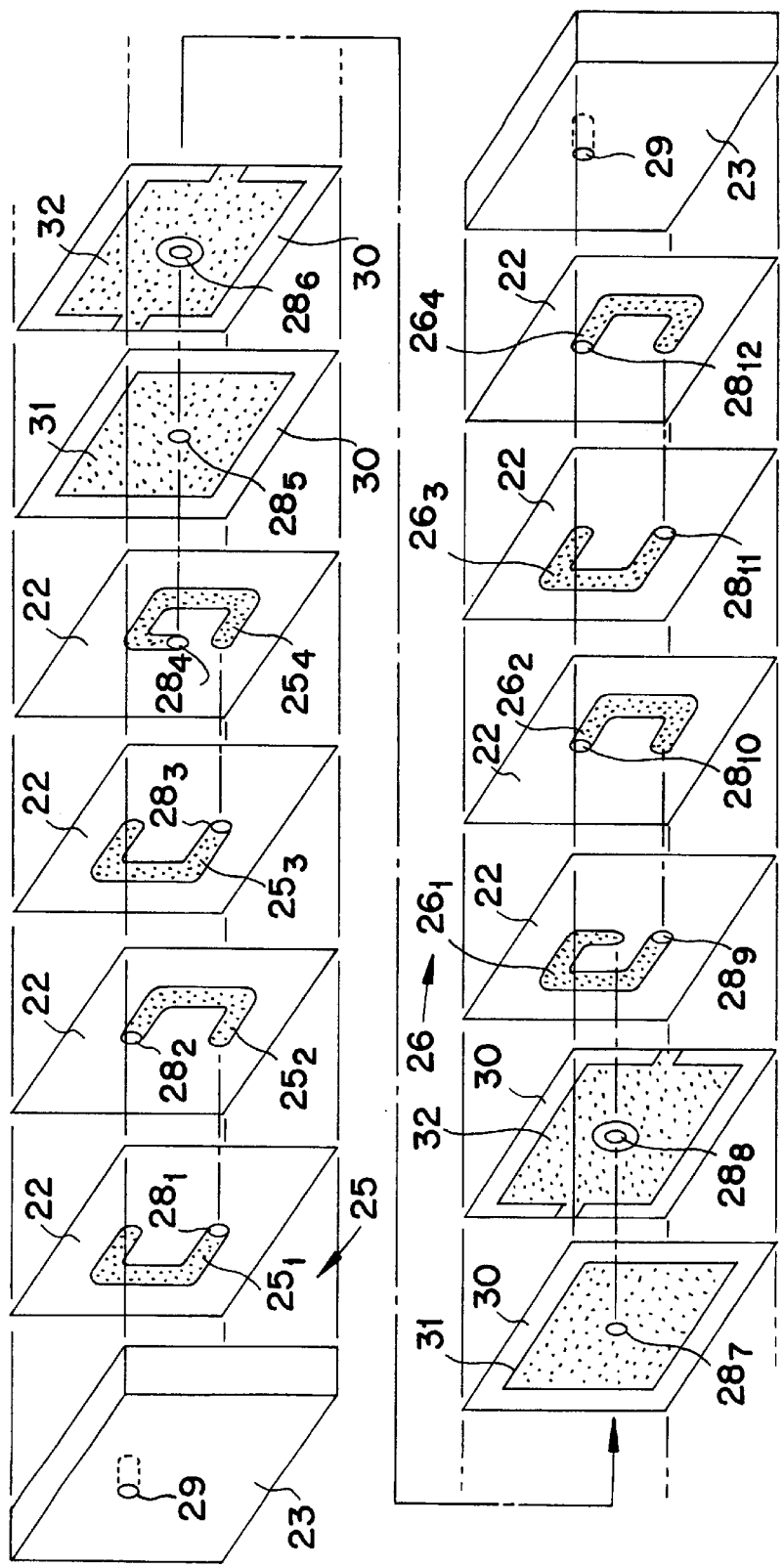
FIG. 5 is an exploded perspective view showing a laminated electronic component according to a second exemplary embodiment of the present invention.

As shown in FIG. 5, a laminated LC filter 21 includes insulating sheets 22 on which coil conductors $25_1$, $25_2$, $25_3$, $25_4$, $26_1$, $26_2$, $26_3$ and $26_4$ are formed, insulating sheets 23 on which extension via-holes 29 are formed, and insulating sheets 30 on which capacitor electrodes 31 and 32 are formed. A solenoid 25 is formed by electrically connecting the coil conductors $25_1$ to $25_4$ in series via relay via-holes $28_1$ to $28_4$ formed on the insulating sheets 22. Similarly, a solenoid 26 is formed by electrically connecting the coil conductors $26_1$ to $26_4$ via the relay via-holes $28_9$ to $28_{12}$ formed on the insulating sheets 22.

The capacitor electrodes 31 are connected in series between the coils 25 and the coils 26 via the relay via-holes $28_4$ to $28_8$. The other capacitor electrodes 32 are disposed to surround the relay via-holes $28_6$ and $28_8$, with a predetermined distance provided therebetween. One end of the capacitor electrode 32 is exposed at the front side of the insulating sheet 30, while another end thereof is exposed at the back side of the insulating sheet 30. Electrostatic capacitance is formed between the capacitor electrodes 31 and 32.

The thickness of the insulating sheet 22 or 30 is set to approximately 20 to 30 μm, for example. In addition, the thickness of the outermost insulating sheet 23 is set to approximately 50 to 100 μm or more, for example. A magnetic material is used as the material for the insulating sheet 22 or 23, and a dielectric material is used as the material for the insulating sheet 30.

Figure 6:
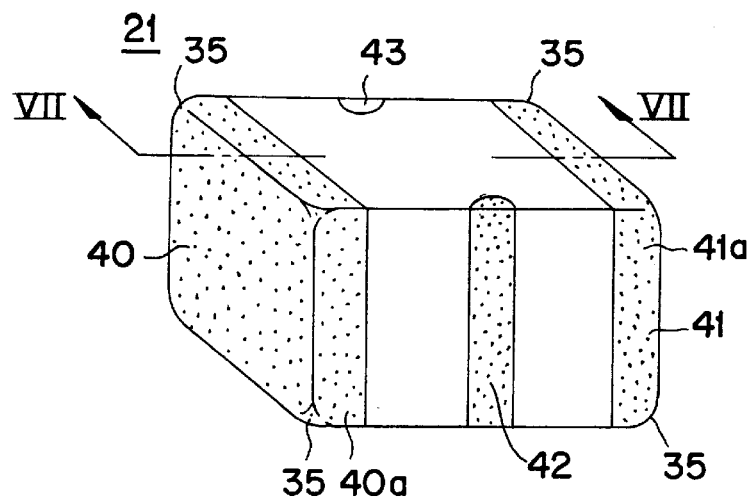
FIG. 6 is a perspective view showing the exterior of the laminated electronic component shown in FIG. 5.
Figure 7:
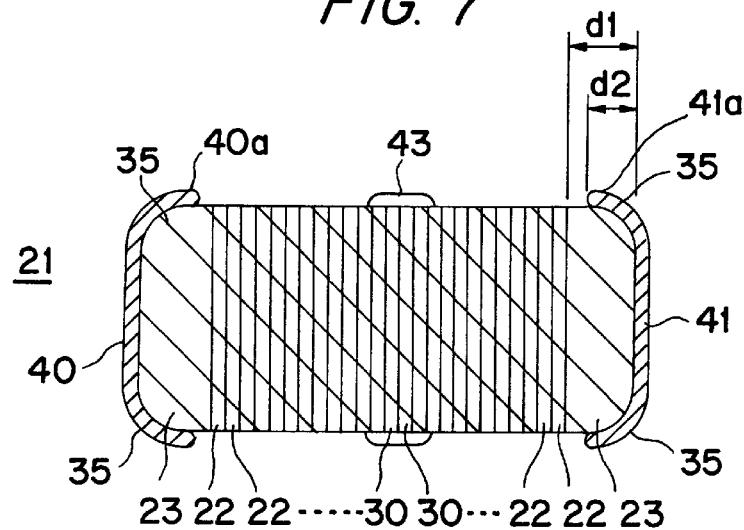
FIG. 7 is a cross-sectional view taken on line VII—VII shown in FIG. 6.

The respective insulating sheets 22, 23 and 30 are stacked, and are subsequently sintered together to form a laminate. Next, as shown in FIGS. 6 and 7, the corners 35 of the laminate are rounded by barrel polishing. The radius of the rounded corner 35 is set equal to or less than the thickness d1 of the insulating sheet 23. Accordingly, a mechanical stress when barrel polishing is performed is not exerted on the mutual interfaces of the insulating sheets. This eliminates deterioration in the interlayer adhesion at the corners 35. The specific radius of the rounded corner 35 is, for example, between approximately 50 and 100 μm.

Next, input/output external electrodes 40 and 41 are formed on the left and right sides of the laminate, respectively. Ground external electrodes 42 and 43 are formed on the front and back sides of the laminate, respectively. The length d2 of a folded portion 40a or 41a of the input/output external electrodes 40 or 41 is set equal to or less than the thickness d1 of the outermost insulating sheet 23. The specific length d2 of the folded portion 40a or 41a is, for example, between approximately 50 to 100 μm.

Figure 8:
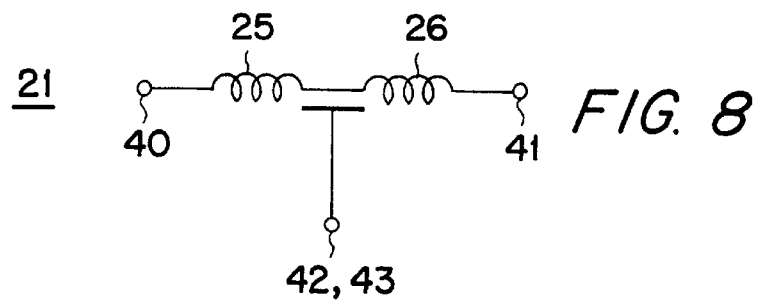
FIG. 8 is an electrical equivalent circuit diagram of the laminated electronic component shown in FIG. 6.
Figure 9:
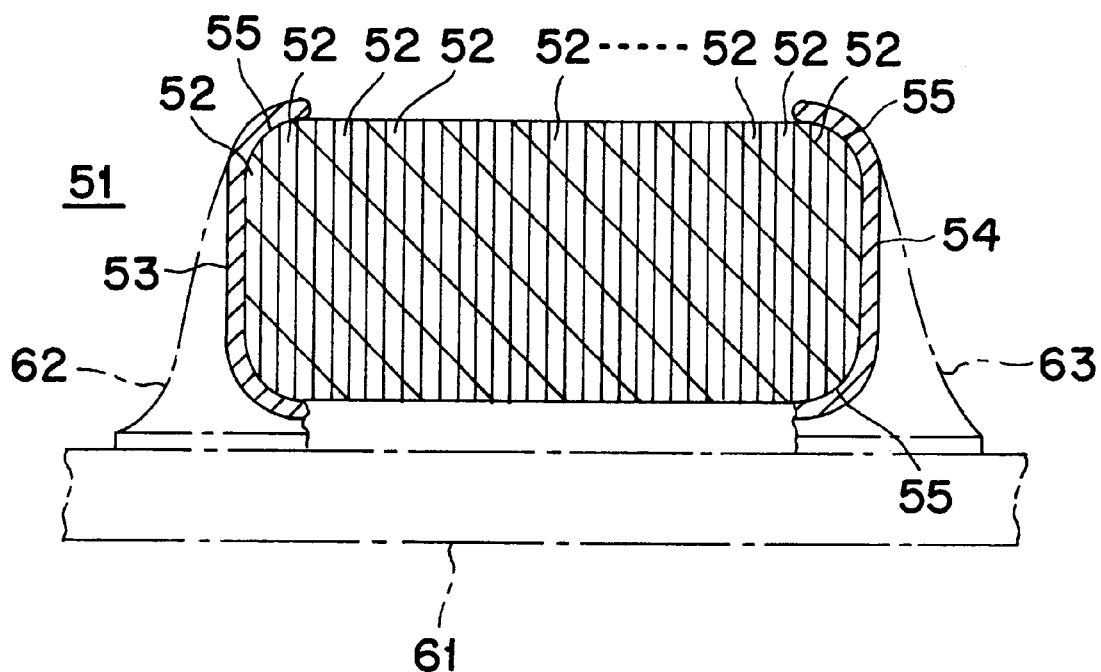
FIG. 9 is a cross-sectional view showing a conventional laminated electronic component.

The input/output external electrode 40 is electrically connected via the extension via-hole 29 to one end of the coil 25; specifically, the electrode 40 is connected to one end of the coil conductor $25_1$. The input/output external electrode 41 is electrically connected via the extension via-hole 29 to one end of the coil 26; specifically, the electrode 41 is connected to one of the coil conductor $26_4$. The ground external electrodes 42 and 43 are electrically connected to ends of the capacitor electrodes 32, respectively. FIG. 8 shows an electrical equivalent circuit diagram of the LC filter 21. The thus obtained LC filter 21 operates similar to the inductor 1 according to the first embodiment.

Other Embodiments

A laminated electronic component according to the present invention is not limited to the foregoing embodiments, but may be modified in various ways within the spirit of the present invention.

It is not necessary to perform both the setting of the thickness of an outermost insulating sheet to be larger than the radius of a laminate's rounded corner and to be larger than the folded-portion thickness of an external electrode as in the foregoing embodiments. Either setting may be performed.

In addition, an outermost insulating sheet may be formed by using several insulating sheets whose thicknesses are larger than the thickness of an insulating sheet provided between internal electrodes.

Although the second embodiment has been described as a case in which two coils and one capacitor are used, the number of built-in coils and capacitors are optional. Increasing the number of the coils and capacitors increases the number of ground external electrodes formed on sides of the laminate. Electronic components constructed in accordance with the principles of the present invention may include a varistor and a capacitor in addition to a laminated inductor and an LC filter.

According to the foregoing embodiments, insulating sheets are stacked, and are sintered together to form a laminate. However, the present invention is not limited thereto. Previously sintered insulating sheets may be used. In addition, a laminated electronic component may be obtained such that an insulating paste and a conductive paste are sequentially applied, dried and re-applied by a method such as printing.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims.

What is claimed is:

1. A laminated electronic component comprising:
   a laminate formed by stacking inner insulators and opposing a pair of outer insulators;
   an inner conductor formed on at least one of said inner insulators;
   a pair of external electrodes formed on said pair of outer insulators;
   wherein at least one of said pair of outer insulators has at least one rounded corner, wherein a thickness of said at least one outer insulator is larger than a radius of said at least one rounded corner;
   wherein a direction in which said insulators are stacked is perpendicular to said external electrodes.

2. The laminated electronic component of claim 1, wherein said at least one inner conductor comprises a plurality of coil conductors formed on respective inner insulators, said coil conductors together forming a coil.

3. The laminated electronic component of claim 2, wherein said coil conductors are connected together in series by a plurality of via-holes which link adjacent coil conductors.

4. The laminated electronic component of claim 3, wherein said external electrodes are connected to said coil by via-holes which extend through said outer insulators.

5. The laminated electronic component of claim 2, further including at least one pair of capacitor electrodes formed on at least one pair of said inner insulators.

6. The laminated electronic component of claim 5, wherein said at least one pair of capacitor electrodes are disposed within said laminate such that a first plurality of said coil conductors are located on one side of said capacitor electrodes, and a second plurality of said coil conductors are located on another side of said capacitor electrodes, wherein said first plurality and said second plurality of coil conductors form first and second coils, respectively.

7. The laminated electronic component of claim 6, wherein said at least one pair of capacitor electrodes comprises two pairs of capacitor electrodes, wherein two capacitor electrodes among said two pairs of capacitor electrodes are connected in series between said first and second coils.

8. The laminated electronic component of claim 1, wherein said at least one rounded corner is formed by a barrel polishing process.

9. The laminated electronic component of claim 1, wherein a thickness of at least one of said outer insulators is between approximately 50 $\mu$m and 100 $\mu$m, and the thickness of the inner insulators is between approximately 20 $\mu$m to 30 $\mu$m.

10. A laminated electronic component comprising:
    a laminate formed by stacking inner insulators and a pair of opposing outer insulators;
    an inner conductor formed on at least one of said inner insulators;
    a pair of external electrodes formed on said pair of outer insulators, said pair of external electrodes having folded portions on ends thereof;
    wherein at least one of said pair of outer insulators has a thickness which is larger than a length of the folded portion of the external electrode disposed thereon;
    wherein a direction in which said insulators are stacked is perpendicular to said external electrodes.

11. The laminated electronic component of claim 10, wherein said at least one inner conductor comprises a plurality of coil conductors formed on respective inner insulators, said coil conductors together forming a coil.

12. The laminated electronic component of claim 11, wherein said coil conductors are connected together in series by a plurality of via-holes which link adjacent coil conductors.

13. The laminated electronic component of claim 12, wherein said external electrodes are connected to said coil by via-holes which extend through said outer insulators.

14. The laminated electronic component of claim 11, further including at least one pair of capacitor electrodes formed on at least one pair of said inner insulators.

15. The laminated electronic component of claim 14, wherein said at least one pair of capacitor electrodes are disposed within said laminate such that a first plurality of said coil conductors are located on one side of said capacitor electrodes, and a second plurality of said coil conductors are located on another side of said capacitor electrodes, wherein said first plurality and said second plurality of coil conductors form first and second coils, respectively.

16. The laminated electronic component of claim 15, wherein said at least one pair of capacitor electrodes comprises two pairs of capacitor electrodes, wherein two capacitor electrodes among said two pairs of capacitor electrodes are connected in series between said first and second coils.

17. The laminated electronic component of claim 10, wherein at least one outer insulator includes at least one rounded corner.

18. The laminated electronic component of claim 10, wherein a thickness of at least one of said outer insulators is between approximately 50 $\mu$m and 100 $\mu$m, and the thickness of the inner insulators is between approximately 20 $\mu$m to 30 $\mu$m.

19. A laminated electronic component comprising:
    a laminate formed by stacking inner insulators and a pair of opposing outer insulators, wherein at least one of said pair of outer insulators has at least one rounded corner;
    an inner conductor formed on at least one of said inner insulators, a plurality of inner conductors forming at least one coil;
    a pair of external electrodes formed on said pair of outer insulators which have folded portions on ends thereof;
    wherein a thickness of said at least one outer insulator is larger than a radius of said at least one rounded corner;

wherein a direction in which said insulators are stacked is perpendicular to said external electrodes.

20. The laminated electronic component of claim 19, wherein a thickness of at least one of said outer insulators is between approximately 50 µm and 100 µm, and the thickness of the inner insulators is between approximately 20 µm to 30 µm.

21. The laminated electronic component of claim 19, wherein at least one of said outer insulators has a thickness which is larger than a length of the folded portion of the external electrode disposed thereon.

* * * * *